United States Patent
Zamir et al.

(10) Patent No.: US 9,785,502 B2
(45) Date of Patent: Oct. 10, 2017

(54) PIPELINED DECODER WITH SYNDROME FEEDBACK PATH

(71) Applicant: SANDISK TECHNOLOGIES INC., Plano, TX (US)

(72) Inventors: Ran Zamir, Ramat Gan (IL); Omer Fainzilber, Even-Yehuda (IL); Eran Sharon, Rishon Lezion (IL)

(73) Assignee: SanDisk Technologies LLC, Plano, TX (US)

( * ) Notice: Subject to any disclaimer, the term of this patent is extended or adjusted under 35 U.S.C. 154(b) by 43 days.

(21) Appl. No.: 14/924,249

(22) Filed: Oct. 27, 2015

(65) Prior Publication Data

US 2017/0116077 A1   Apr. 27, 2017

(51) Int. Cl.
| | | |
|---|---|---|
| *G11C 29/00* | (2006.01) | |
| *G06F 11/10* | (2006.01) | |
| *G11C 29/52* | (2006.01) | |
| *H03M 13/11* | (2006.01) | |
| *H03M 13/37* | (2006.01) | |
| *G11C 29/04* | (2006.01) | |

(52) U.S. Cl.
CPC .......... *G06F 11/1072* (2013.01); *G11C 29/52* (2013.01); *H03M 13/1102* (2013.01); *H03M 13/37* (2013.01); *G11C 2029/0411* (2013.01)

(58) Field of Classification Search
CPC ............. G06F 11/1072; G11C 29/52; H03M 13/1102; H03M 13/37; H03M 13/1137; H03M 13/114; H03M 13/116; H03M 13/1188; H03M 13/13; H03M 13/1111; H03M 13/6563; H03M 13/6566; H03M 13/05; H03M 13/1128; H03M 13/1157; H03M 13/1145
See application file for complete search history.

(56) References Cited

U.S. PATENT DOCUMENTS

| 5,715,262 | A | 2/1998 | Gupta | |
|---|---|---|---|---|
| 2009/0187808 | A1 | 7/2009 | Nichols | |
| 2010/0269020 | A1* | 10/2010 | Heinrich | H03M 13/1111 714/763 |
| 2011/0161770 | A1* | 6/2011 | Ueng | H03M 13/1137 714/752 |
| 2013/0275838 | A1* | 10/2013 | Henige | H03M 13/13 714/776 |
| 2014/0059402 | A1* | 2/2014 | Le Bars | H03M 13/05 714/752 |
| 2015/0078477 | A1* | 3/2015 | Hong | H04L 27/2602 375/295 |
| 2015/0348605 | A1* | 12/2015 | Jang | G11C 7/22 365/230.02 |

FOREIGN PATENT DOCUMENTS

WO   WO2007069183   A2   6/2007

* cited by examiner

*Primary Examiner* — Guerrier Merant
(74) *Attorney, Agent, or Firm* — Toler Law Group, PC

(57) ABSTRACT

A device includes a memory a memory configured to store syndromes. The device also includes a pipelined data processing unit and routing circuitry. The routing circuitry includes a first input coupled to the memory and includes a second input coupled to an output of the pipelined data processing unit.

20 Claims, 3 Drawing Sheets

PIPELINED DECODER WITH SYNDROME FEEDBACK PATH

FIELD OF THE DISCLOSURE

This disclosure is generally related to error correction coding (ECC) decoders.

BACKGROUND

Non-volatile storage devices, such as flash memory devices, have enabled increased portability of data and software applications. For example, flash memory devices can enhance data storage density by storing multiple bits in each cell of the flash memory. To illustrate, Multi-Level Cell (MLC) flash memory devices provide increased storage density by storing 3 bits per cell, 4 bits per cell, or more. Electronic devices, such as mobile phones, typically use non-volatile storage devices, such as flash memory devices, for persistent storage of information, such as data and program code that is used by the electronic device. Advances in technology have resulted in increased storage capacities of non-volatile storage devices with reductions in storage device size and cost.

To correct data errors, a flash memory device may utilize an error correcting code (ECC) technique. For example, the flash memory device may encode user data using an ECC technique to generate encoded data, such as an ECC codeword. The encoded data may be stored at the flash memory device and may be decoded by a decoder of the flash memory device, such as in response to a request for read access to the data from a host device that accesses the flash memory device.

The flash memory device may use a low-density parity check (LDPC) decoding technique to decode the data. The LDPC decoding technique may use a parity check matrix to decode an ECC codeword, such as by multiplying the parity check matrix and the ECC codeword to generate "decoded" data. Because the ECC codeword includes parity bits that satisfy a set of parity equations specified by the parity check matrix, one or more bit errors in the ECC codeword can be corrected using the LDPC decoding technique.

An LDPC decoding operation may be performed (or represented) using variable nodes and check nodes. The variable nodes may represent bit values of the ECC codeword, and the check nodes may represent the parity equations of the parity check matrix. Each variable node may be connected to one or more of the check nodes. The connections between variable nodes and check nodes (or "constraints") may represent the set of parity equations specified by the parity check matrix. If bit values of decoded data satisfy the set of parity equations, then the decoded data is "correct" (e.g., has been successfully decoded).

Because of the latency and power consumption associated with LDPC computations, another decoding technique may be used (e.g., to reduce power or latency or both) for decoding of codewords having relatively few errors. For example, a bit-flipping operation may be performed that attempts to identify erroneous bits based on a number of unsatisfied parity equations in which the bits participate. However, as ECC codes become increasingly complex and as decoders are executed at faster clock rates, latency and power consumption of such bit-flipping operations also increases.

DETAILED DESCRIPTION

Figure 1:
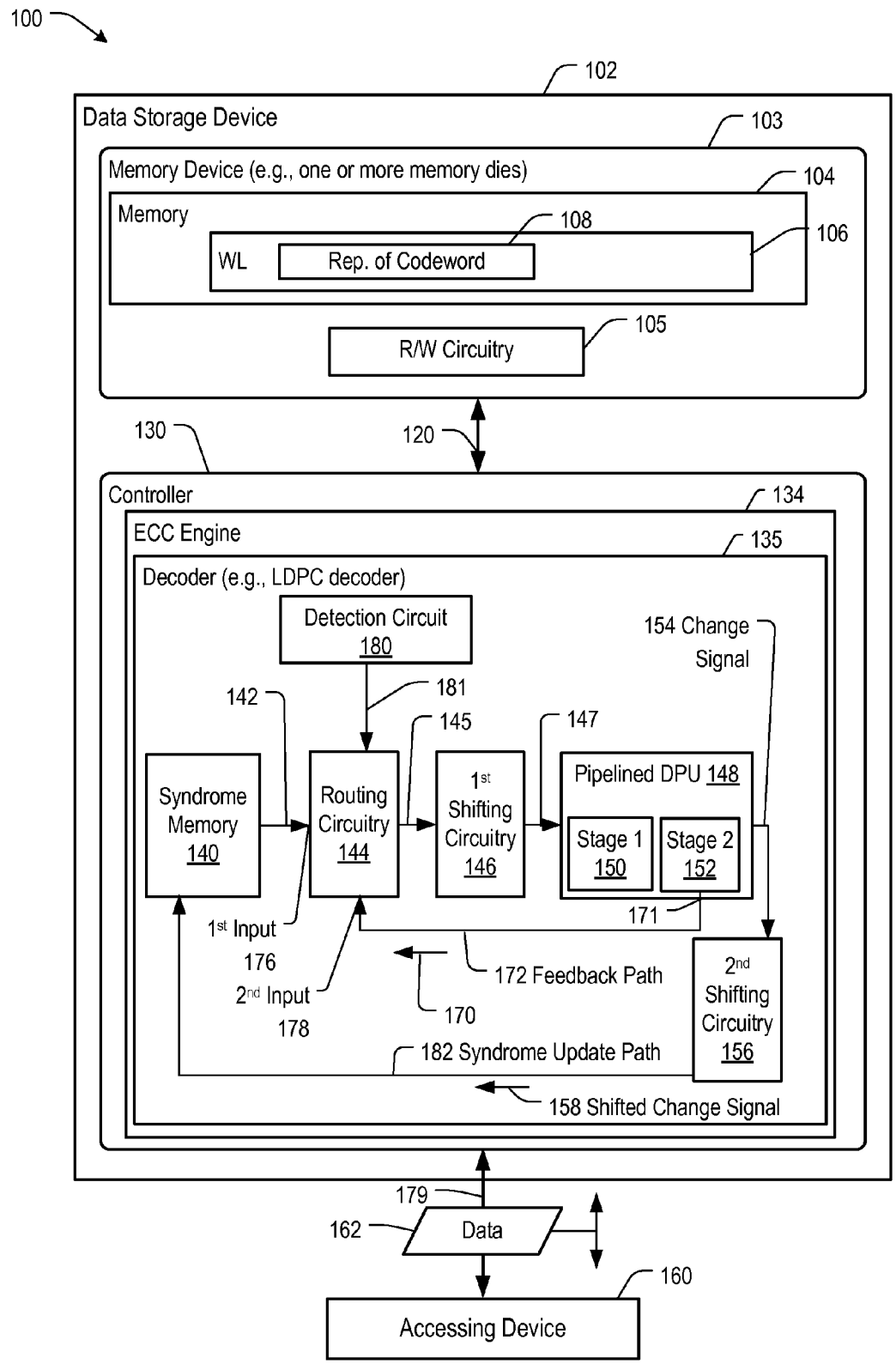
FIG. 1 is a block diagram of a particular illustrative example of a system including a data storage device that includes a pipelined ECC decoder.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of ECC decoding using a pipelined decoder that includes a feedback path. Pipelining enables the decoder to perform a larger number of computations for each variable node by spreading out the computations over multiple clock cycles as compared to a number of computations that could be performed in a single clock cycle of a decoder. For example, a bit-flipping decoder may have a pipelined architecture to enable a relatively large number of computations to be performed for each variable node, or for multiple variable nodes in parallel, at a relatively high clock rate. However, as an amount of parallelism and/or a pipeline depth increases, the number of pipeline stalls due to data hazards between variable nodes may increase, resulting in an increase in the decoding latency of the pipelined bit-flipping decoder.

A feedback path may be used to reduce or eliminate pipeline stalls due to data hazards between variable nodes. Data hazards may occur because each variable nodes participates in multiple parity check equations. Each parity check equation is evaluated based on values of the variable nodes that participate in the parity check equation to generate a result, referred to as a "syndrome." Changing the value of a variable node also changes the value of each syndrome in which the variable node participates. However, syndrome values may also be used to determine whether to change a value of a variable node. Thus, when two variable nodes participate in a common syndrome, the second of the two variable nodes should not be processed until the first of the two variable nodes has been processed and an updated value of the syndrome is available. A pipeline stall that may result from delaying processing of the second variable node can be avoided by using the feedback path to provide updated syndrome values to an input of the pipeline before the updated syndrome values are stored to a syndrome memory. Thus, a pipeline stall due to the delay associated with storing the updated syndromes to the syndrome memory and retrieving the updated syndromes from the syndrome memory may be avoided.

FIG. 1 depicts an illustrative example of a system 100 that includes a data storage device 102 and an accessing device 160. The data storage device 102 includes a controller 130 (e.g., a memory controller) and a memory device 103 that is coupled to the controller 130. The memory device 103 may include one or more memory dies. The controller 130 including an error correction coding (ECC) decoder 135 that is configured, during decoding of a representation 108 of a codeword from the non-volatile memory of the memory device 103, to select a syndrome from a memory 140 or from a feedback path 172 that is coupled to a pipelined data processing unit (DPU) 148.

The data storage device 102 and the accessing device 160 may be coupled via a connection (e.g., a communication path 179), such as a bus or a wireless connection. The data storage device 102 may include a first interface (e.g., an accessing device interface) that enables communication via the communication path 179 between the data storage device 102 and the accessing device 160.

In some implementations, the data storage device 102 may be embedded within the accessing device 160, such as in accordance with a Joint Electron Devices Engineering Council (JEDEC) Solid State Technology Association Universal Flash Storage (UFS) configuration. For example, the data storage device 102 may be configured to be coupled to the accessing device 160 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the accessing device 160 (i.e., "removably" coupled to the accessing device 160). As an example, the data storage device 102 may be removably coupled to the accessing device 160 in accordance with a removable universal serial bus (USB) configuration.

In some implementations, the data storage device 102 may include or correspond to a solid state drive (SSD) which may be included in, or distinct from (and accessible to), the accessing device 160. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the accessing device 160 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the accessing device 160 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The accessing device 160 may include a memory interface (not shown) and may be configured to communicate with the data storage device 102 via the memory interface to read data from and write data to the memory device 103 of the data storage device 102. For example, the accessing device 160 may operate in compliance with a Joint Electron Devices Engineering Council (JEDEC) industry specification, such as a Universal Flash Storage (UFS) Access Controller Interface specification. As other examples, the accessing device 160 may operate in compliance with one or more other specifications, such as a Secure Digital (SD) Access Controller specification, as an illustrative, non-limiting example. The accessing device 160 may communicate with the memory device 103 in accordance with any other suitable communication protocol.

The accessing device 160 may include a processor and a memory. The memory may be configured to store data and/or instructions that may be executable by the processor. The memory may be a single memory or may include multiple memories, such as one or more non-volatile memories, one or more volatile memories, or a combination thereof. The accessing device 160 may issue one or more commands to the data storage device 102, such as one or more requests to erase data, to read data from, or to write data to the memory device 103 of the data storage device 102. For example, the accessing device 160 may be configured to provide data, such as data 162, to be stored at the memory device 103 or to request data to be read from the memory device 103. The accessing device 160 may include a mobile telephone, a computer (e.g., a laptop, a tablet, or a notebook computer), a music player, a video player, a gaming device or console, an electronic book reader, a personal digital assistant (PDA), a portable navigation device, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks of storage elements (e.g., also referred to herein as memory cells). For example, each of the blocks may include a NAND flash erase block. Each storage element of the memory 104 may be programmable to a state (e.g., a threshold voltage in a flash configuration or a resistive state in a resistive memory configuration) that indicates one or more values. Each block of the memory 104 may include one or more word lines, such as a representative word line (WL) 106. Although the memory 104 is illustrated as including a single representative word line, in other implementations, the memory 104 may include any number of word lines. Each word line may include one or more pages, such as one or more physical pages. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write (R/W) circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory device 103 may be coupled via a bus 120 to the controller 130. For example, the bus 120 may include one or more channels to enable the controller 130 to communicate with a single memory die of the memory device 103. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the accessing device 160 and to send data to the accessing device 160. For example, the controller 130 may send data to the accessing device 160 via the communication path 179, and the controller 130 may receive data from the accessing device 160 via the communication path 179. The controller 130 is configured to send data and commands to the memory 104 and to receive data from the memory 104. For example, the controller 130 is configured to send data and a write command to cause the memory 104 to store data to an address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 includes an error correction code (ECC) engine 134. The ECC engine 134 may include an encoder configured to encode one or more data words using an ECC encoding technique. The ECC engine 134 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 134 also includes the decoder 135. The decoder 135 is configured to decode data read from the memory 104 to detect and correct, up to an error correction capability of the ECC scheme, bit errors that may be present in the data. The decoder 135 may include a relatively low-power, high-speed decoder (e.g., a bit-flipping decoder). The ECC engine 134 may also include a full-power LDPC decoder (not shown) with a higher correction capacity than the decoder 135.

The decoder 135 includes the memory 140, routing circuitry 144, first shifting circuitry 146, the pipelined data processing unit (DPU) 148, second shifting circuitry 156, and a detection circuit 180. The decoder 135 may be configured to perform an iterative low-power decoding operation on received data, such as the representation 108 of the codeword that is read from the memory 104. To illustrate, the representation 108 may match a valid codeword of an ECC scheme or may differ from the valid codeword due to one or more errors (e.g., due to data retention or disturb effects in the memory 104). The decoder 135 may map symbols (e.g., bits) of the representation 108 to variable nodes of a bipartite graph that corresponds to the ECC scheme and may selectively change the symbols based on how many unsatisfied parity checks that each symbol participates in.

For example, the decoder 135 may select a first variable node corresponding to a first symbol of a codeword to be decoded and may determine whether to change the symbol based on how many unsatisfied parity check equations the first symbol participates in. After determining whether to change the symbol, the decoder 135 updates any syndromes that are affected by the change in the symbol and continues with processing a next symbol of the codeword. Processing may continue until all parity checks have been satisfied (e.g., all syndromes are '0'), indicating a successful convergence to a valid codeword.

To illustrate, in a binary LDPC implementation, each symbol is a single bit and each syndrome is a single bit. A number of non-zero syndromes (e.g., representing unsatisfied parity check equations) associated with a symbol may be compared to a threshold, and if the number of non-zero syndromes equals or exceeds the threshold, the symbol bit may be changed (e.g., "flipped"). Although a binary LDPC implementation is described herein, in other implementations, the decoder 135 may be configured to perform pipelined low-power decoding of non-binary codewords (e.g., decoding multi-bit symbols based on multi-bit syndromes).

If all variable nodes are processed and one or more parity check equations remain unsatisfied (e.g., one or more syndrome is '1'), the decoder 135 may be configured to repeat processing one or more times, up to a threshold number of decoding iterations. In case the decoder 135 has not converged within the threshold number of decoding iterations, the ECC engine 134 may initiate decoding using a higher-power decoder (e.g., a full-power LDPC decoder).

The memory 140 is configured to store syndromes during a decoding operation. For example, the memory 140 may include any type of memory, such as a static random access memory (SRAM) or a register file, as illustrative, non-limiting examples. The memory 140 may store values of parity check equations that may be accessed during each cycle of a decoding operation of the decoder 135. To illustrate, syndrome(s) 142 associated with one or more variable nodes to be processed during a particular cycle may be provided to the routing circuitry 144. Syndromes to be updated (e.g., based on determining that a processed variable node has changed value during the cycle) may be altered at the memory 140 in response to receiving syndrome change information via a syndrome update path 182.

The routing circuitry 144 has a first input 176 coupled to the memory 140 and has a second input 178 coupled to an output 171 of the pipelined data processing unit 148. The first input 176 is configured to receive the syndrome(s) 142 read from the memory 140, and the second input 178 is configured to receive one or more syndromes 170 via the feedback path 172 from the pipelined data processing unit 148. The routing circuitry 144 is responsive to a control signal 181 (e.g., from the detection circuit 180) to select a syndrome from the first input 176 or from the second input 178 and to send the selected syndrome(s) 145 to the first shifting circuitry 146.

The first shifting circuitry 146 is configured to apply a first shift operation to first syndrome data (e.g., the syndrome(s) 142) received via the first input 176 of the routing circuitry 144. The first shifting circuitry 146 is also configured to apply a second shift operation to second syndrome data (e.g., the syndrome(s) 170) received via the second input 178 of the routing circuitry 144. The first shift operation may include shifting the first syndrome data by a first shift amount. The second shift operation may include shifting the second syndrome data by a second shift amount that is different from the first shift amount. The syndrome(s) 147 shifted by the first shift amount or the second shift amount are output to the pipelined data processing unit 148.

The pipelined data processing unit 148 is configured to generate a signal corresponding to a symbol of a codeword, illustrated as a change signal 154. The change signal 154 is generated based on a set of syndromes associated with the symbol. For example, the change signal 154 may indicate a change to the symbol, such as when the pipelined data processing unit 148 determines that a bit corresponding to a particular variable node is to be flipped. The change signal 154 may indicate that each syndrome corresponding to a parity check equation that the bit participates in is to be updated. The change signal 154 may be shifted by the second shifting circuitry 156 and provided to the memory 140 via the syndrome update path 182.

The pipelined data processing unit 148 includes multiple pipeline stages including a first stage 150 and a second stage 152. For example, the first stage 150 may include circuitry configured to perform a first portion of computations associated with determining a count of satisfied or unsatisfied parity check equations that a particular variable node participates in. The pipelined data processing unit 148 may include one or more pipeline registers (not shown) to store data generated in the first stage 150 to be provided as input data to the second stage 152. The second stage 152 may include circuitry configured to perform a second portion of the computations associated with the particular variable node and to generate a determination of whether to change a value of a symbol corresponding the variable node. For example, in a binary LDPC implementation, each symbol is a bit and changing a value of the symbol corresponds to "bit-flipping," such as by performing a logical NOT operation on the bit to change a '1' value to a '0' value or to change a '0' value to a '1' value. An example of components that may be included in the pipelined data processing unit 148 is described in further detail with respect to FIG. 2.

The second shifting circuitry 156 is coupled to an output of the pipelined data processing unit 148 and to the memory 140. The second shifting circuitry 156 is configured to apply a shift operation to the change signal 154 to generate a shifted change signal 158. The shift operation applied by the second shifting circuitry 156 may be configured to reverse or "unshift" the shift operation that was applied by the first shifting circuitry 146.

The detection circuit 180 is configured to generate the control signal 181 based on whether contention is detected between variables of two variable nodes that results in a data hazard condition. For example, the detection circuit 180 may be configured to detect whether a syndrome associated with a first symbol to be processed in the first stage 150 during a particular pipeline cycle is also associated with a second symbol to be processed in the second stage 152 during the particular pipeline cycle. To illustrate, during an initial clock cycle of a decoding operation, processing of a first variable node of a codeword may be performed in the first stage 150. During a second sequential clock cycle of the decoding operation, processing of a second variable node of the codeword may be performed in the first stage 150 and processing of the first variable node may be performed in the second stage 152. During a third sequential clock cycle of the decoding operation, processing of a third variable node of the codeword may be performed in the first stage 150 and processing of the second variable node may be performed in the second stage 152. The detection circuit 180 may be configured to determine whether a syndrome associated with the first variable node is also associated with the second variable node to detect contention during the second sequential clock cycle, to determine whether a syndrome associated with the second variable node is also associated with the third variable node to detect contention during the third sequential clock cycle, etc.

During operation, the controller 130 may receive a request from the accessing device 160 to retrieve data that is stored at the word line 106. The controller 130 may receive the representation 108 of the codeword from the memory 104 and may provide the representation 108 to the ECC engine 134. The controller 130 may indicate to the ECC engine 134 an ECC scheme that was used for encoding the data, such as by identifying an LDPC code.

The ECC engine 134 may populate registers or other memory with bit values corresponding to variable nodes and may generate an initial set of syndromes in the memory 140 based on the indicated ECC scheme. In response to determining that at least one syndrome is non-zero, the ECC engine 134 may initiate a decoding operation at the decoder 135.

During a first decoding pipeline cycle, the decoder 135 may select a first bit of the data to be decoded (e.g., a sequentially first bit of the representation 108, corresponding to a first variable node) to initiate a bit-flipping operation. The detection circuit 180 may access data corresponding to the ECC scheme, such as from a read-only memory (ROM) or other memory of the controller 130, and may determine which syndromes are to be retrieved for the selected bit, such as by identifying row indices of non-zero values in a column of a parity check matrix that corresponds to the selected bit. An indication of the syndromes to be retrieved may be provided to the memory 140 and/or to the routing circuitry 144. The detection circuit 180 may also generate the control signal 181 to indicate to the routing circuitry 144 that the syndrome(s) 142 at the first input 176 are to be selected.

The routing circuitry 144 outputs the syndrome(s) 142 as the syndrome(s) 145 that are received by the first shifting circuitry 146. The first shifting circuitry 146 performs a first shift operation to the syndrome(s) 145 based on a control signal that may be received from the detection circuit 180. For example, when the ECC scheme corresponds to a quasi-cyclic LDPC (QC-LDPC) code, a parity check matrix for the QC-LPDC code may include multiple sub-matrices that are either cyclically shifted versions of the identity matrix or zero matrices. The detection circuit 180 may identify, for each syndrome retrieved from the memory 140 for processing the first bit, a shift amount to be applied to the syndrome, such as a shift amount of a circular bit-shift operation, to align the syndrome with a designated input of the pipelined data processing unit 148. The detection circuit 180 may send a signal to the first shifting circuitry 146 to indicate the identified shift amount(s). The detection circuit 180 may indicate multiple shift amounts to the first shifting circuitry 146 in a single pipeline cycle. For example, one or more of the syndrome(s) 145 may be shifted by a shift amount that is independent of the shift amount(s) of one or more of the other syndrome(s) 145. The first shifting circuitry 146 may shift the syndrome(s) 145 to generate the shifted syndrome(s) 147. Although the first shifting circuitry 146 is described as applying a shift operation, it should be understood that, for some syndromes, the shift operation may apply a zero shift amount (e.g., no shift is performed).

The pipelined data processing unit 148 receives the syndrome(s) 147 and initiates computations to determine whether to flip the first bit corresponding to the first variable node. For example, during the first stage 150, at least a portion of a summing operation may be performed to determine the number of non-zero syndromes in the received syndrome(s) 147. Data generated for the first variable node during the first pipeline cycle is stored in a pipeline register to be input to the second stage 152 for processing during a next pipeline cycle of the decoding operation.

During a second pipeline cycle, processing of the first variable node completes at the second stage 152 with a determination of whether the value of the first variable node is to be changed (e.g., whether to flip the first bit of the representation 108). The value of the first variable node may be selectively changed in response to the determination, and the pipelined data processing unit 148 outputs the change signal 154 indicating whether the value of the first variable node has been changed. As explained further with respect to FIG. 2, the change signal 154 may correspond to a multi-bit signal that indicates a change flag for each of the syndrome(s) 147. The second shifting circuitry 156 may apply a shift operation to the change signal 154 (e.g., may apply one or more circular bit shift(s) having a shift amount(s) that is opposite the shift amount(s) applied by the first shifting circuitry 146 during the first pipeline cycle) and may output a shifted change signal 158 to the memory 140. The memory 140 may update values of syndromes that are stored in the memory 140, such as by applying an XOR operation of the stored syndrome values and the shifted change signal 158 and storing the output of the XOR operation in the memory 140 as updated syndromes.

The pipelined data processing unit 148 may also generate updated syndrome values, such as by bit-flipping each of the syndromes 147 in response to changing the value of the first variable node. The pipelined data processing unit 148 may output the updated syndrome values as the syndrome(s) 170. The routing circuitry 144 receives the syndrome(s) 170 at the second input 178 via the feedback path 172.

Also during the second pipeline cycle, processing of a second variable node is initiated. The detection circuit 180 may indicate the syndrome(s) 142 corresponding to the second variable node and may also determine whether any of the syndromes corresponding to the second variable node correspond to the first variable node that is undergoing processing at the pipelined data processing unit 148. If none of the syndromes corresponding to the second variable node correspond to the first variable node, the detection circuit 180 indicates via the signal 181 that the routing circuitry 144 is to select the syndrome(s) 142 via the first input 176. In addition, the detection circuit 180 may indicate a shift amount to the first shifting circuitry 146 based on a shift amount indicated by the ECC scheme for one or more of the syndrome(s) 145.

Alternatively, if the detection circuit 180 detects a data hazard—that is, one or more of the syndrome(s) 142 corresponding to the second variable node also correspond to the first variable node—the detection circuit 180 may indicate via the signal 181 that the routing circuitry 144 is to select the updated syndrome(s) 170 from the feedback path 172. In addition, the detection circuit 180 may indicate a shift amount to the first shifting circuitry 146 based on a first shift amount indicated by the ECC scheme that was applied in the first pipeline cycle for the first variable node and further based on a second shift amount indicated by the ECC scheme that is to be applied for the first pipeline stage for the second variable node. For example, the shift amount that is applied at the first shifting circuitry 146 to a syndrome from the feedback path 172 may equal the second shift amount for the second variable node minus the first shift amount for the first variable node. By selecting the syndrome(s) 170 from the feedback path 172 in response to detecting the data hazard, the second variable node may begin processing using updated syndrome values before the syndrome values are updated in the memory 140 via the syndrome update path 182.

Pipelined processing of the remaining variable nodes may continue in a substantially similar manner as described for the first and second variable nodes. Decoding may terminate in response to determining that all syndrome values are zero, and the decoded data represented by the variable nodes may be provided to the accessing device 160. Alternatively, if a number of decoding iterations reaches the decoding iteration threshold, decode processing at the decoder 135 may terminate and decoding may be performed at another ECC decoder of the ECC engine 134 that has a higher error correction capability.

By selecting syndrome data from the memory 140 or from the feedback path 172 based on whether a data hazard is detected, the ECC decoder 135 reduces or eliminates pipeline stalls. Reducing or eliminating pipeline stalls due to data hazards enables a larger number of variable nodes to be processed in parallel for increasingly complex ECC codes while maintaining relatively high-speed, low-power decoding capability at the decoder 135.

Although the pipelined data processing unit 148 is illustrated as having two stages 150-152, in other implementations the pipelined data processing unit 148 may include more than two stages. Although the detection circuit 180, the routing circuitry 144, the first shifting circuitry 146, the pipelined DPU 148, and the second shifting circuitry 156 are illustrated as discrete components, in other implementations two or more of the detection circuit 180, the routing circuitry 144, the first shifting circuitry 146, the pipelined DPU 148, or the second shifting circuitry 156 may be combined. For example, the first shifting circuitry 146 and the routing circuitry 144 may be combined into a single circuit that selects between the inputs 176, 178 and applies a shift amount to generate the syndrome(s) 145. Further, although the decoder 135 includes the first shifting circuitry 146 and the second shifting circuitry 156, in other implementations the first shifting circuitry 146 and the second shifting circuitry 156 may be omitted. For example, in an implementation where the ECC scheme does not correspond to a QC-LDPC code, syndromes may be routed to the pipelined DPU 148 without shifting.

Figure 2:
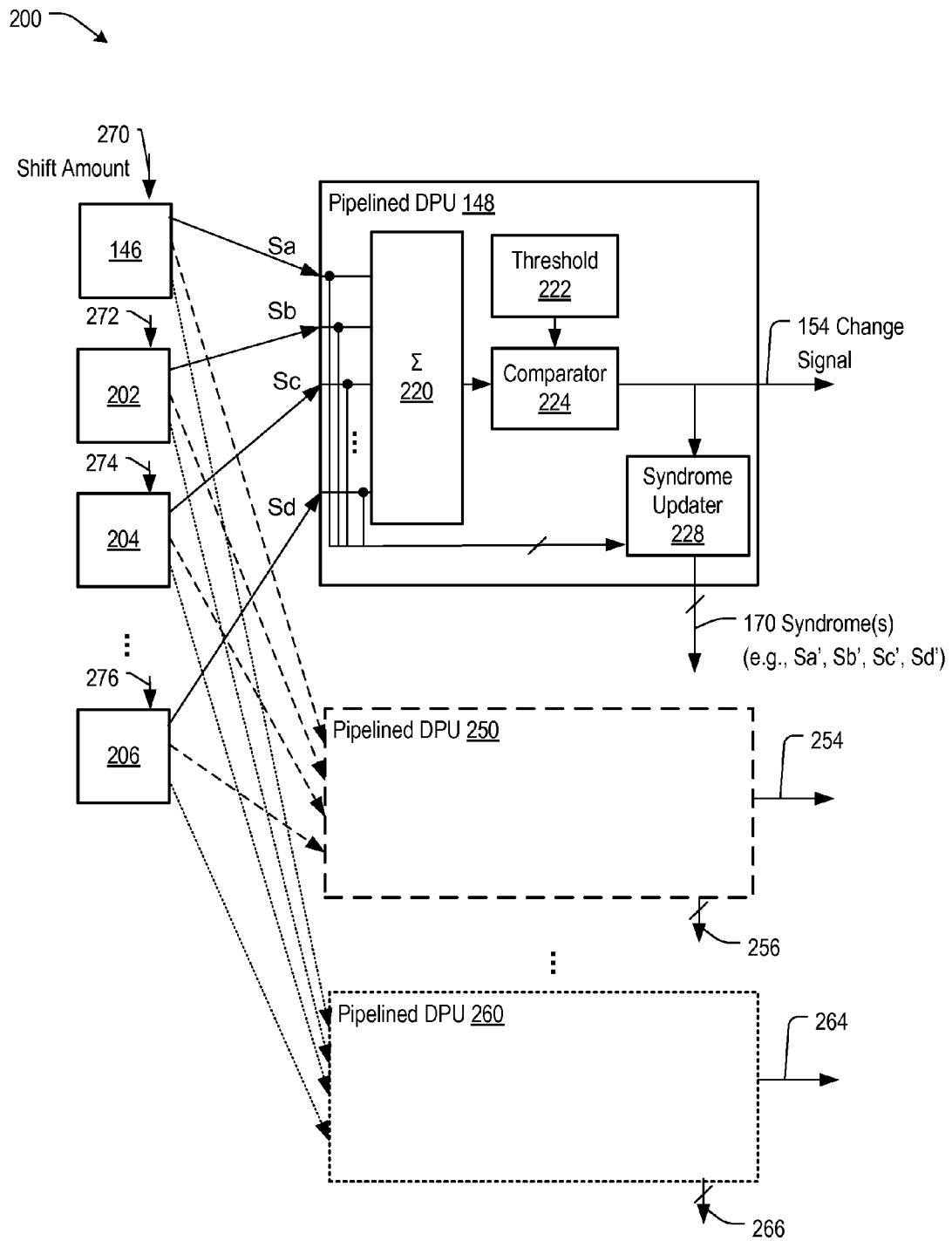
FIG. 2 is a block diagram of a particular illustrative example of components that may be included in the ECC decoder of FIG. 1.

FIG. 2 depicts an illustrative implementation 200 of a decoder including components that may be included in the decoder 135 of FIG. 1. The implementation 200 includes multiple shifters, including the first shifting circuitry 146, a second shifting circuit 202, a third shifting circuit 204, and a fourth shifting circuit 206. The implementation 200 also includes multiple pipelined DPUs, including the pipelined DPU 148, a second pipelined DPU 250 and, a third pipelined DPU 260. Although four shifters and three pipelined DPUs are illustrated, in other implementations other numbers of shifters and pipelined DPUs may be included. For example, the implementation 200 may support an ECC scheme that has a parity check matrix that includes 'm' block rows of size 'z' and 'n' block columns of size z, where each variable node participates in up to 'l' parity check equations, and where m, n, z, and l are positive integers. The implementation 200 may include l shifters, with each of the l shifters configured to perform a shift of z syndromes, and may also include z pipelined DPUs, to process all variable nodes of a block column in parallel.

Each of the shifters 146, 202, 204, and 206 is configured to receive a respective set of syndromes (e.g., sets of syndromes read from the syndrome memory 140 or received from the feedback path 172 and provided to the shifters 146, 202, 204, and 206 by the routing circuitry 144). Each of the shifters 146, 202, 204, and 206 may also receive a respective signal from the detection circuit 180 indicating a circular bit-shift amount to be applied by the respective shifter, such as a first shift amount 270 that may be received by the first shifting circuitry 146, a second shift amount 272 that may be received by the second shifting circuit 202, a third shift amount 274 that may be received by the third shifting circuit 204, and a fourth shift amount 276 that may be received by the fourth shifting circuit 206. Each of the shift amounts 270, 272, 274, and 276 may be determined based on the ECC scheme and may differ from each other. Each of the shifters 146, 202, 204, and 206 provides an output syndrome to each of the pipelined DPUs 148, 250, and 260. For example, a first shifted output syndrome of each of the shifters 146, 202, 204, and 206 may be provided to the pipelined DPU 148, a second shifted output syndrome of each of the shifters 146, 202, 204, and 206 may be provided to the second pipelined DPU 250, and a third shifted output syndrome of each of the shifters 146, 202, 204, and 206 may be provided to the third pipelined DPU 260.

The pipelined DPU 148 includes a summer circuit 220, a comparator 224, and a syndrome updater 228. The summer circuit 220 is configured to generate an output indicating a number of '1' values received at the inputs of the summer circuit 220. Each input of the summer circuit 220 is coupled to an output of a shifter 146, 202, 204, or 206. For example, the summer circuit 220 is configured to receive a first syndrome 'Sa' from the first shifting circuitry 146, a second syndrome 'Sb' from the second shifting circuit 202, a third syndrome 'Sc' from the third shifting circuit 204, and a fourth syndrome 'Sd' from the fourth shifting circuit 206, and to output a value indicating how many of the syndromes Sa, Sb, Sc, and Sd have '1' values.

The comparator 224 is configured to generate an output value that indicates a result of comparing the output of the summer circuit 220 to a threshold 222. For example, the threshold 222 may indicate a threshold number of unsatisfied parity checks that a variable node may participate in that may be used as part of a decision of whether to change the value of the variable node. In some implementations, the output of the comparator 224 may indicate a bit flip decision and may have a '1' value to indicate that the output of the summer circuit 220 exceeds the threshold 222 or may have a '0' value to indicate that the output of the summer circuit 220 is less or equal to than the threshold 222. The output of the comparator 224 may be output by the pipelined DPU 148 as the change signal 154 of FIG. 1. Circuitry to change a value of a variable node based on the output of the comparator 224 may be included in the decoder 135 of FIG. 1, such as at an input to a variable node memory, or may be included in the pipelined DPU 148.

The syndrome updater 228 includes circuitry configured to selectively change a value of each of the received syndromes Sa, Sb, Sc, and Sd based on the output of the comparator 224. For example, the syndrome updater 228 may include multiple XOR gates, each XOR gate receiving a syndrome at a first input and the change signal 154 at a second input. Outputs of the syndrome updater 228 may be provided as the updated syndrome(s) 170, represented as Sa', Sb', Sc', and Sd'. When the number of unsatisfied parity checks is less than the threshold, Sa', Sb', Sc', and Sd' equal Sa, Sb, Sc, and Sd, respectively. Otherwise, Sa', Sb', Sc', and Sd' equal the logical inverse of Sa, Sb, Sc, and Sd, respectively.

The pipelined DPU 148 may be divided into the first stage 150 and the second stage 152 of FIG. 1 via inclusion of a pipeline register (not shown). For example, the pipeline register may be included within the summer circuit 220, at the output of the summer circuit 220, or at the output of the comparator 224, as illustrative, non-limiting examples.

Each of the pipelined DPUs 250, 260 may have a similar structure to the pipelined DPU 148 and may operation in a similar manner as the pipelined DPU 148. The second pipelined DPU 250 may be configured to generate a second change signal 254 corresponding to a second variable node and to generate updated syndromes 256 to be provided to the routing circuitry 144 via the feedback path 172 of FIG. 1. The third pipelined DPU 250 may be configured to generate a third change signal 264 corresponding to a third variable node and to generate updated syndromes 266 to be provided to the routing circuitry 144 via the feedback path 172 of FIG. 1.

Although the pipelined DPU 148 is illustrated and described with respect to a bit-flipping technique based on comparing a number of unsatisfied parity check equations to a threshold, on other implementations other techniques may be used. For example, in another implementation the DPU 148 may include circuitry configured to perform another decoding technique, such as a Gallager-A or Gallager-B technique, as illustrative, non-limiting examples. To illustrate, the pipelined DPU 148 may be configured to make a bit flip decision based on whether a majority of the syndromes associated with the variable node are satisfied or unsatisfied.

Although the syndrome updater 228 is illustrated as a component within each of the pipelined DPUs 148, 250, and 260, in other implementations a syndrome updater circuit may instead be external to the pipelined DPUs 148, 250, and 260 and may be responsive to bit flip decisions (e.g., the change signal 154) from each of the pipelined DPUs 148, 250, and 260. For example, each of the "feedback syndrome" values (the syndrome(s) 170) provided to the routing circuitry 144 via the feedback path 172 of FIG. 1 may be generated as indicated in Equation 1, where "syndrome" indicates the value of the syndrome input to the pipelined DPUs 148, 250, and 260 and "bit flip decisions" indicates the change signals 154, 254, 264 corresponding to variable nodes that participate in the parity check equation for the syndrome from the pipelined DPU and "⊕" represents a XOR operation.

$$\text{feedback syndrome} = \text{syndrome} \oplus \text{bit flip decisions} \quad \text{Equation 1:}$$

By including multiple pipelined DPUs, multiple variable nodes may be processed in parallel each cycle of the decoding pipeline. In QC-LDPC implementations, variable nodes corresponding to an entire block column of a parity check matrix may be processed in parallel to provide reduced memory access and shifting complexity as compared to implementations where fewer than all variable nodes of a block column are processed in parallel. In implementations where a syndrome update circuit is external to the pipelined DPUs and responsive to the change signals of each of the DPUs, multiple block columns may be processed in parallel in each cycle of the decoding pipeline for further reduction of decoding latency without introducing pipeline stalls due to variable contention.

Figure 3:
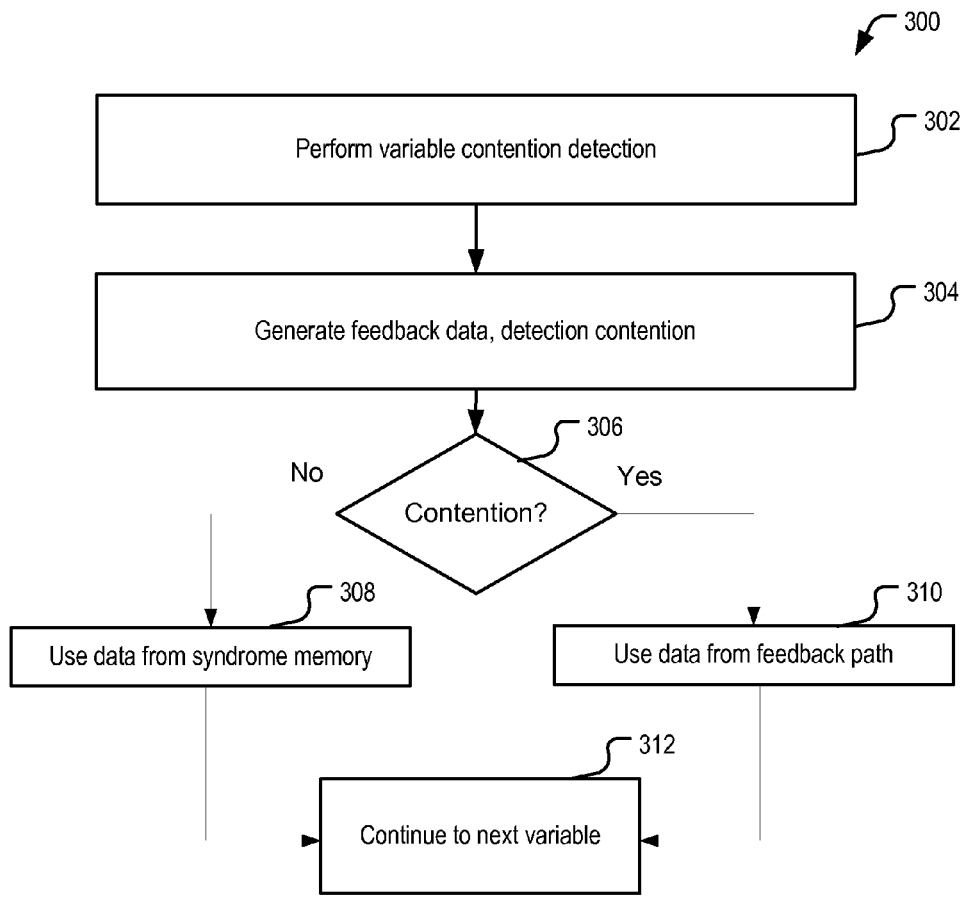
FIG. 3 is a flowchart of a particular illustrative example of a method of pipelined ECC decoding that may be performed by the data storage device of FIG. 1.

Referring to FIG. 3, a particular illustrative example of a method of pipelined ECC decoding is depicted and generally designated 300. The method 300 may be performed at a device that includes a non-volatile memory and a controller. For example, the device may include or correspond to the data storage device 102.

The method 300 includes performing variable contention detection, at 302. For example, the variable contention detection may be performed by the detection circuit 180 of FIG. 1.

Feedback data and contention detection data may be generated, at 304. For example, the feedback data may be generated by one or more pipelined data processing units (e.g., the pipelined DPU 148 of FIG. 1) and may correspond to the updated syndrome(s) 17 of FIG. 1. The contention detection data may indicate whether variable contention is detected and may be indicated via the control signal 181 of FIG. 1.

A determination of whether contention has been detected, at 306. For example, the routing circuitry 144 of FIG. 1 may configure input selection circuitry (e.g., a multiplexer) to select the first input 176 or the second input 178 based on a value of the received control signal 181. In response to no contention being detected, data from the syndrome memory is used, at 308. For example, the routing circuitry 144 may select the syndrome(s) 142 at the first input 176. Otherwise, in response to contention being detected, data from the feedback path is used, at 310. For example, the routing circuitry 144 may select the updated syndrome(s) 170 from the feedback path 172.

Processing continues to the next variable, at 312. For example, during each cycle of the pipelined decoding operation, one or more variable nodes may enter the decoding pipeline for processing. By selecting, based on whether variable contention is detected, to use syndromes from the syndrome memory or from the feedback path, data hazards are avoided and pipeline stalls due to them may be reduced or eliminated and an average decoding latency may be reduced.

Figure 4:
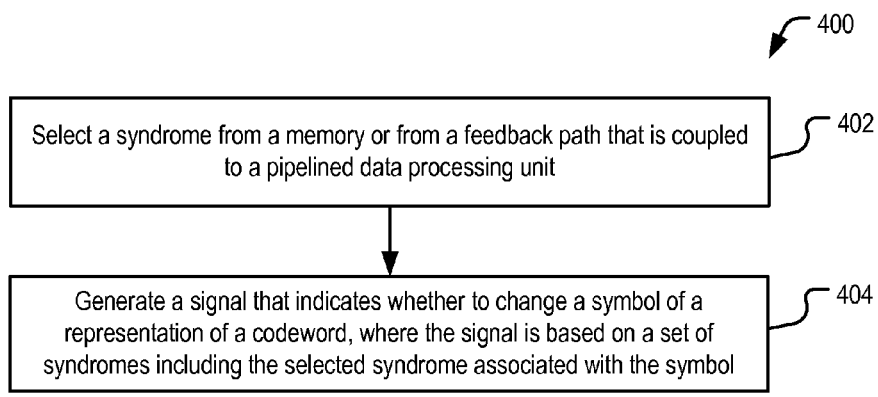
FIG. 4 is a flowchart of another illustrative example of a method of pipelined ECC decoding that may be performed by the data storage device of FIG. 1.

Referring to FIG. 4, a particular illustrative example of a method of pipelined ECC decoding is depicted and generally designated 400. The method 400 may be performed at a device that includes a non-volatile memory and an error correction coding (ECC) decoder. For example, the device may include or correspond to the data storage device 102.

The method 400 includes selecting a syndrome from a memory or from a feedback path that is coupled to a pipelined data processing unit, at 402. For example, the routing circuitry 144 may select from the syndrome(s) 142 of the syndrome memory 140 or the updated syndrome(s) 170 of the feedback path 172 based on the control signal 181 from the detection circuit 180. To illustrate, the detection circuit 180 may detect whether the syndrome is associated with a first symbol and with a second symbol, the first symbol to be processed in the first stage 150 of the pipelined data processing unit 148 during a particular pipeline cycle and the second symbol to be processed in the second stage 152 of the pipelined data processing unit 148 during the particular pipeline cycle.

In some implementations, a first shift operation may be applied to first syndrome data received from the memory or a second shift operation may be applied to second syndrome data received from the feedback path. For example, the first shifting circuitry 146 may apply a first shift amount to syndrome data received from the memory 140 or may apply a second shift amount to syndrome data received from the feedback path 172.

A signal that indicates whether to change a symbol of a representation of a codeword is generated, at 404. The signal is based on a set of syndromes including the selected syndrome associated with the symbol. For example, the signal may correspond to the change signal 154 of FIG. 1.

By selecting the syndrome from the memory or from the feedback path, decoding latency may be reduced due to the reduction or elimination of pipeline stalls. Selection of updated syndromes from the feedback path in response to detecting a data hazard due to variable node contention in the pipelined data processing unit enables pipelined processing to proceed using the updated syndrome values before the syndrome values are updated at the syndrome memory. Reduction or elimination of pipeline stalls may also enable additional decoding latency reduction via decoding of a larger number of variable nodes in parallel during each cycle of a pipelined decoding operation.

Although various components of the data storage device 102, such as the detection circuit 180 and the pipelined DPU 148 of FIG. 1 are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method 300 of FIG. 3 or one or more operations of the method 400 of FIG. 4.

Alternatively or in addition, one or more aspects of the data storage device 102, such as the detection circuit 180 and/or the pipelined DPU 148, may be implemented using a microprocessor or microcontroller programmed (e.g., by executing instructions) to perform operations described herein, such as one or more operations of the method 300 of FIG. 3, the method 400 of FIG. 4, or a combination thereof, as described further herein. In some implementations, each of the controller 130, the memory device 103, and/or the accessing device 160 may include a processor executing instructions that are stored at a memory, such as a non-volatile memory of the data storage device 102 or of the accessing device 160 of FIG. 1. Alternatively or additionally, executable instructions that are executed by the processor may be stored at a separate memory location that is not part of the non-volatile memory, such as at a read-only memory (ROM) of the data storage device 102 or the accessing device 160 of FIG. 1.

With reference to FIG. 1, the data storage device 102 may be attached to or embedded within one or more accessing devices, such as within a housing of the accessing device 160. For example, the data storage device 102 may be embedded within the accessing device 160 in accordance with a Joint Electron Devices Engineering Council (JEDEC) Solid State Technology Association Universal Flash Storage (UFS) configuration. To further illustrate, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other implementations, the data storage device 102 may be implemented in a portable device configured to be selectively coupled to one or more external accessing devices. For example, the data storage device 102 may be removable from the accessing device 160 (i.e., "removably" coupled to the accessing device 160). As an example, the data storage device 102 may be removably coupled to the accessing device 160 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

The memory 104 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 may include another type of memory. In some implementations, one or more of the memory 104 may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents,gh and shall not be restricted or limited by the foregoing detailed description.

What is claimed is:

1. A device comprising:
a memory configured to store syndromes;
a pipelined data processing unit including a first stage and a second stage configured to process a first symbol and a second symbol, respectively, during a pipeline cycle; and
routing circuitry configured to select a syndrome from the memory or an output of the pipelined data processing unit based on whether the syndrome is associated with the first symbol and the second symbol.

2. The device of claim 1, further comprising a detection circuit configured to detect whether the syndrome is associated with the first symbol to be processed in the first stage during a particular pipeline cycle and is also associated with the second symbol to be processed in the second stage during the particular pipeline cycle.

3. The device of claim 1, wherein the pipelined data processing unit is configured to generate a signal corresponding to a symbol of a codeword, and wherein the signal is based on a set of syndromes associated with the symbol and is configured to indicate a change to the symbol.

4. The device of claim 1, wherein the pipelined data processing unit is configured to:
generate a signal indicative of a change to a symbol of a codeword; and
provide the signal to the memory via a syndrome update path.

5. The device of claim 1, further comprising shifting circuitry configured to perform a first shift operation on first syndrome data received via a first input of the routing circuitry and to perform a second shift operation on second syndrome data received via a second input of the routing circuitry.

6. The device of claim 1, further comprising shifting circuitry configured to receive syndrome data from the routing circuitry, to perform a first shift operation that includes shifting first syndrome data by a first shift amount, and to perform a second shift operation that includes shifting second syndrome data by a second shift amount that is different from the first shift amount.

7. The device of claim 1, further comprising shifting circuitry coupled to the pipelined data processing unit and to the memory.

8. A data storage device comprising:
a non-volatile memory; and
a controller coupled to the non-volatile memory, the controller including an error correction coding (ECC) decoder that includes:

a memory;
a pipelined data processing unit that includes a first stage and a second stage configured to process a first symbol and a second symbol, respectively, during a pipeline cycle; and
a feedback path that is coupled to the pipelined data processing unit, and
the ECC decoder configured to, during decoding of a representation of a codeword from the non-volatile memory, select a syndrome from the memory or from the feedback path based on whether the syndrome is associated with the first symbol and the second symbol.

9. The data storage device of claim 8, wherein the pipelined data processing unit is configured to generate a signal corresponding to a symbol of a codeword, and wherein the signal is based on a set of syndromes associated with the symbol.

10. The data storage device of claim 8, the ECC decoder further including a syndrome update path coupled to the pipelined data processing unit and coupled to the memory.

11. The data storage device of claim 8, the ECC decoder further including routing circuitry having a first input coupled to the memory and having a second input coupled to the pipelined data processing unit via the feedback path, wherein the routing circuitry is configured to, responsive to a control signal, select a syndrome from the first input or from the second input.

12. The data storage device of claim 8, the ECC decoder further including a detection circuit configured to generate a control signal that is configured to select the syndrome from the memory or from the feedback path.

13. The data storage device of claim 8, further comprising a detection circuit configured to detect whether the syndrome is associated with the first symbol and the second symbol, the first symbol to be processed in the first stage during a particular pipeline cycle and the second symbol to be processed in the second stage during the particular pipeline cycle.

14. The data storage device of claim 8, the ECC decoder further including shifting circuitry configured to apply a first shift operation to first syndrome data received from the memory and to apply a second shift operation to second syndrome data received from the pipelined data processing unit.

15. The data storage device of claim 8, the ECC decoder further including a low-density parity check (LDPC) decoder that includes:
routing circuitry coupled to the memory and coupled to the pipelined data processing unit via the feedback path; and
shifting circuitry configured to receive syndrome data from the routing circuitry.

16. A method comprising:
selecting a syndrome from a memory or from a feedback path based on whether the syndrome is detected to be associated with a first symbol processible in a first stage of a pipelined processor during a pipeline cycle and with a second symbol processible in a second stage of the pipelined processor during the pipeline cycle, the feedback path coupled to the pipelined processor; and
generating a signal that indicates whether to change a symbol of a representation of a codeword, wherein the signal is based on a set of syndromes including the selected syndrome associated with the symbol.

17. The method of claim 16, further comprising detecting whether the syndrome is associated with the first symbol and with the second symbol, the first symbol to be processed in the first stage at a pipelined data processing unit during a particular pipeline cycle and the second symbol to be processed in the second stage at the pipelined data processing unit during the particular pipeline cycle.

18. The method of claim 16, further comprising determining whether to apply a first shift operation to first syndrome data received from the memory or to apply a second shift operation to second syndrome data received from the feedback path.

19. An apparatus comprising:
means for storing syndromes; and
means for processing data, the means for processing data including a first stage and a second stage configured to process a first symbol and a second symbol, respectively, during a pipeline cycle, and further including a feedback path, wherein the means for processing data is configured to, during decoding of a representation of a codeword from the means for storing syndromes, select a syndrome from the means for storing syndromes or from the feedback path based on whether the syndrome is associated with the first symbol and the second symbol.

20. The apparatus of claim 19, wherein the means for processing data is further configured to generate a signal corresponding to a symbol of a particular codeword, the signal based on a set of syndromes associated with the symbol, and wherein the means for processing data further includes a syndrome update path coupled to the means for processing data and to the means for storing syndromes.

* * * * *